US011528826B2

(12) United States Patent
Gao

(10) Patent No.: US 11,528,826 B2
(45) Date of Patent: Dec. 13, 2022

(54) INTERNAL CHANNEL DESIGN FOR LIQUID COOLED DEVICE

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/095,641

(22) Filed: Nov. 11, 2020

(65) Prior Publication Data

US 2022/0151104 A1 May 12, 2022

(51) Int. Cl.
*H05K 7/20* (2006.01)

(52) U.S. Cl.
CPC ..... *H05K 7/20254* (2013.01); *H05K 7/20772* (2013.01)

(58) Field of Classification Search
CPC .......... H05K 7/20254; H05K 7/20763–20772; H01L 23/473
See application file for complete search history.

(56) References Cited

U.S. PATENT DOCUMENTS

| | | | | |
|---|---|---|---|---|
| 5,159,529 A * | 10/1992 | Lovgren | ............ | H05K 7/20636 361/689 |
| 6,799,628 B1 * | 10/2004 | Masseth | ................ | H01L 23/433 257/E23.113 |
| 9,406,585 B2 * | 8/2016 | Mori | .................... | H01L 21/4882 |
| 10,160,072 B2 * | 12/2018 | Boday | ................ | H05K 7/20254 |
| 2009/0178792 A1 * | 7/2009 | Mori | ...................... | F28F 9/0263 165/170 |
| 2014/0158330 A1 * | 6/2014 | Kuroda | ................... | C22C 21/02 165/170 |
| 2018/0259267 A1 * | 9/2018 | Tsai | ........................ | B23P 15/26 |
| 2020/0275583 A1 * | 8/2020 | Lee | ......................... | H05K 7/205 |

\* cited by examiner

*Primary Examiner* — Zachary Pape
(74) *Attorney, Agent, or Firm* — Womble Bond Dickinson (US) LLP

(57) ABSTRACT

A microprocessor is attached to a cooling plate. The cooling plate is formed of two identical shells, each shell having a fluid chamber therein in communication with one or more fluid channels and a fluid port. The two shells are attached to each other such that the open top of each fluid cavity faces the other open top, so that the two fluid cavities form one large cavity. Fins are positioned inside the fluid cavity so as to form fluid passages between each two fins for the cooling fluid to flow and remove heat from the fins. Fluid chambers formed by the two shells are divided into multiple fluid channels among fins by the fins.

14 Claims, 8 Drawing Sheets

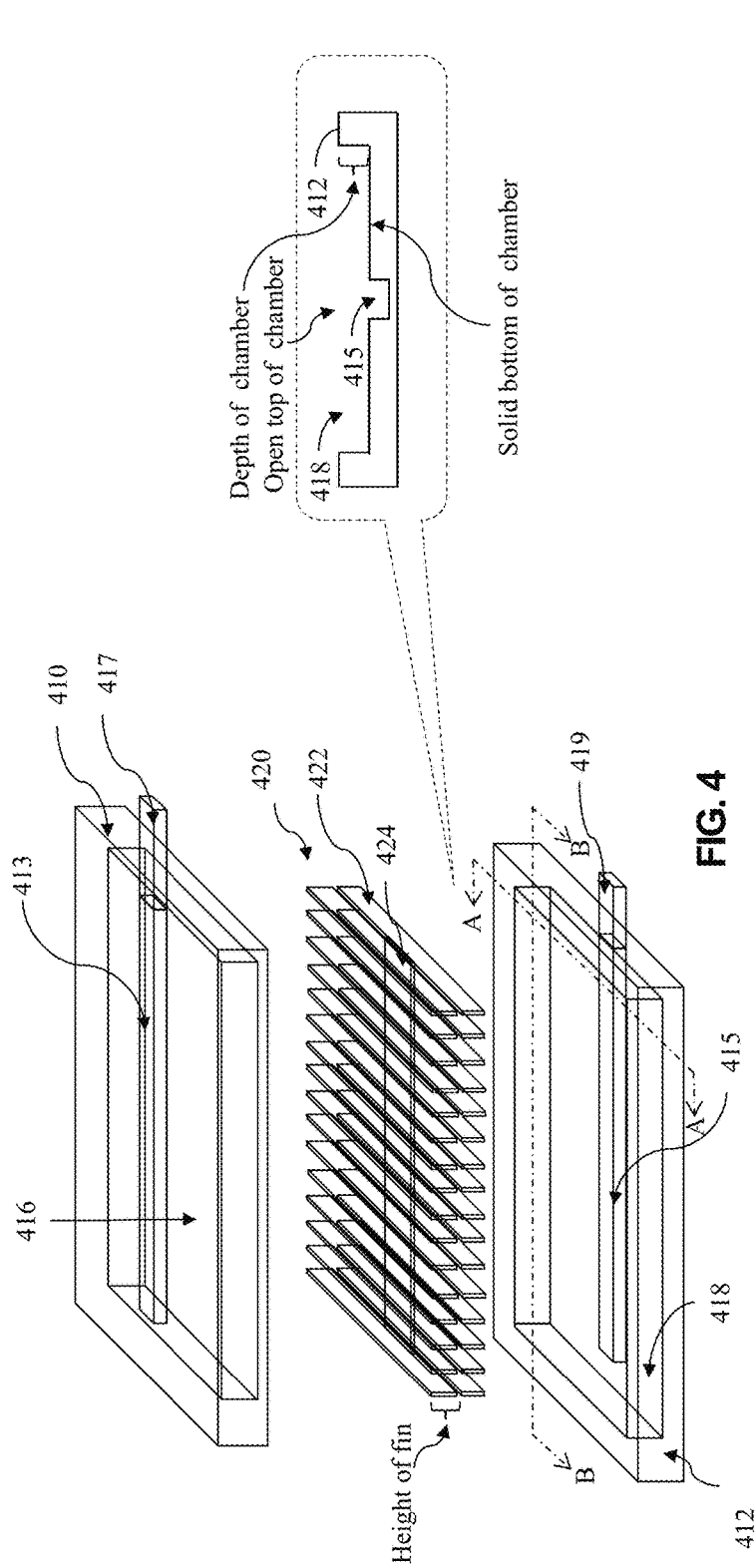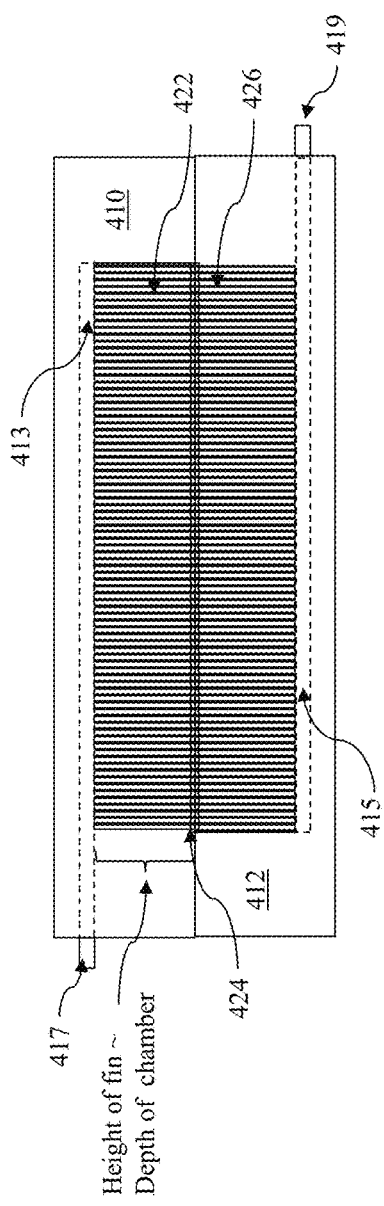

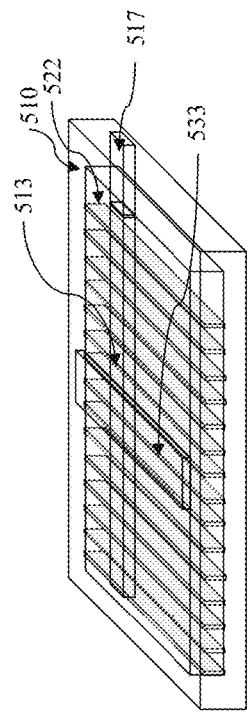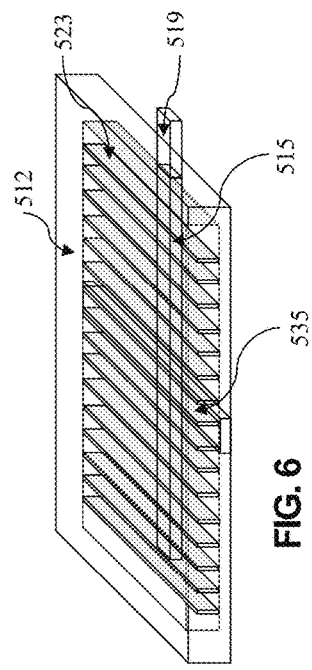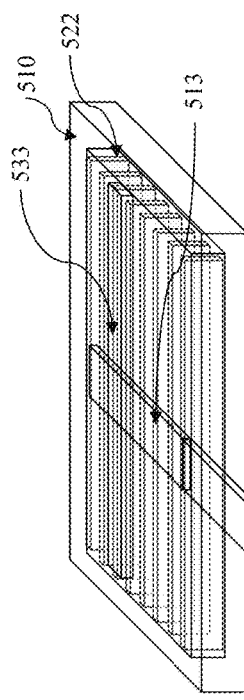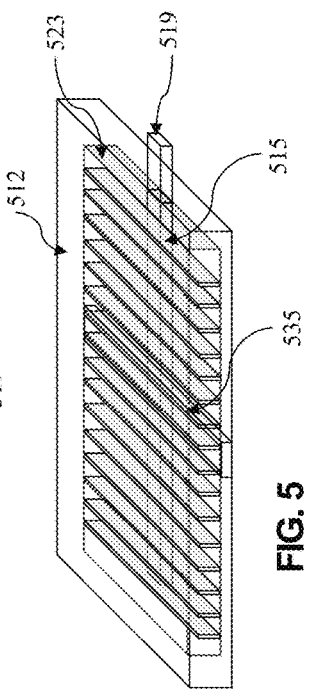
FIG. 5
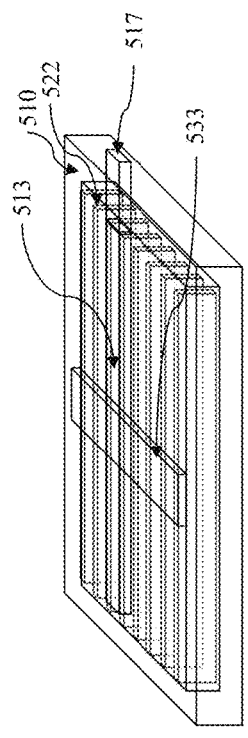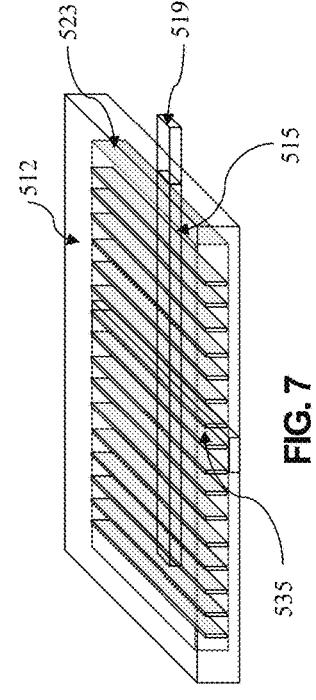
FIG. 6
FIG. 7

US 11,528,826 B2

INTERNAL CHANNEL DESIGN FOR LIQUID COOLED DEVICE

FIELD OF THE INVENTION

Embodiments of the present invention relate generally to data center cooling. More particularly, embodiments of the invention relate to cold plates for liquid cooling of microchips.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

Liquid cooling may be implemented to remove heat from high-end processors, such as CPUs and GPUs. In such systems the processor abuts a cold plate serving as a heat sink, wherein liquid circulates within the cold plate to remove the heat from the cold plate. Various designs have been proposed to generate circuitous path of the liquid flowing inside the cold plate, or to increase the contact area of the liquid with interior surface of the cold plate. Among the consideration of such designs are the pressure, flow rate, flow resistance, cooling capability, power consumption, cost, etc.

BRIEF DESCRIPTION OF THE DRAWINGS

Embodiments of the invention are illustrated by way of example and not limitation in the figures of the accompanying drawings in which like references indicate similar elements.

FIG. 4 is an exploded view illustrating various elements of a cooling plate according to an embodiment, while FIG. 4A is a cross section of the cooling plate of FIG. 4.

FIG. 5 illustrates an embodiment having secondary fluid channels.

FIG. 6 illustrates an embodiment having secondary fluid channels with parallel fins.

FIG. 7 illustrates an embodiment having perpendicular fins and secondary fluid channels.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments disclosed herein include designs for cold plates that can provide efficiency cooling for various applications, while simplifying the production and thereby reducing the cost of the plate. The various designs may involve three parts: two mainframes having liquid chambers therein, the mainframes may be identical, and a set of fins positioned inside the liquid chambers of the two mainframes. Prior to describing the construction and features of the cooling plate, a general description of the computing environment in which the cooling plate is implemented is provided below.

Figure 1:
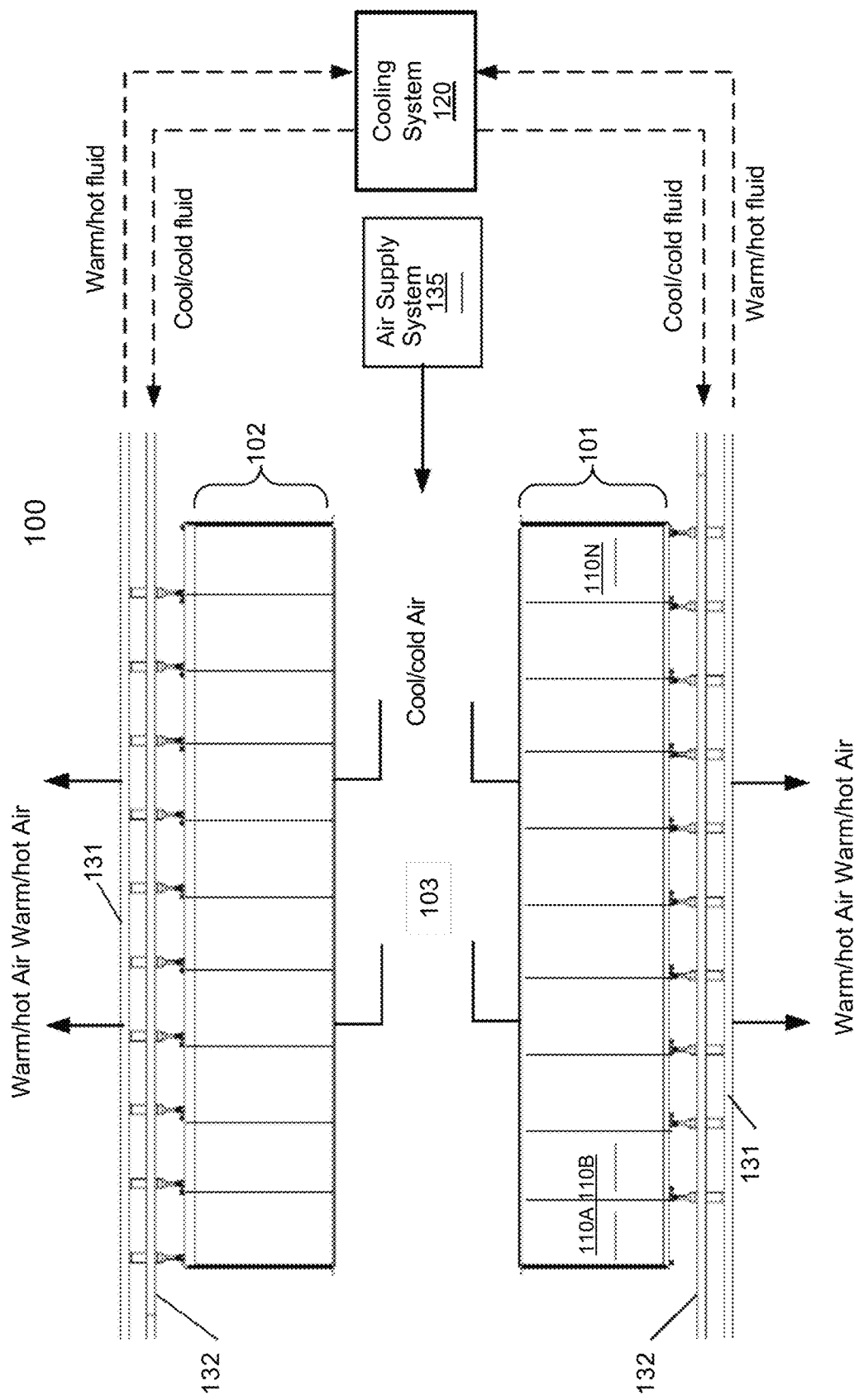
FIG. 1 is a block diagram illustrating an example of a data center facility according to one embodiment.

FIG. 1 is a block diagram illustrating an example of a data center or data center unit employing cooling plates according to disclosed embodiments. In this example, FIG. 1 shows a top view of at least a portion of a data center. Referring to FIG. 1, according to one embodiment, data center system 100 includes one or more rows of electronic racks of information technology (IT) components, equipment or instruments 101-102, such as, for example, computer servers or computing nodes that provide data services to a variety of clients over a network (e.g., the Internet). In this embodiment, each row includes an array of electronic racks such as electronic racks 110A-110N. However, more or fewer rows of electronic racks may be implemented. Typically, rows 101-102 are aligned in parallel with frontends facing towards each other and backends facing away from each other, forming aisle 103 in between to allow an administrative person walking therein. However, other configurations or arrangements may also be applied. For example, two rows of electronic racks may back to back face each other without forming an aisle in between, while their frontends face away from each other. The backends of the electronic racks may be coupled to the room cooling liquid manifolds.

In one embodiment, each of the electronic racks (e.g., electronic racks 110A-110N) includes a housing to house a number of IT components arranged in a stack operating therein. The electronic racks can include a cooling liquid manifold, a number of server slots (e.g., standard shelves or chassis configured with an identical or similar form factor), and a number of server chassis (also referred to as server blades or server shelves) capable of being inserted into and removed from the server slots. Each server chassis represents a computing node having one or more processors, a memory, and/or a persistent storage device (e.g., hard disk), where a computing node may include one or more servers operating therein. At least one of the processors is attached to a liquid cold plate (also referred to as a cold plate assembly) to receive cooling liquid. In addition, one or more optional cooling fans are associated with the server chassis to provide air cooling to the computing nodes contained therein. Note that the cooling system 120 may be coupled to multiple data center systems such as data center system 100.

In one embodiment, cooling system 120 includes an external liquid loop connected to a cooling tower or a dry cooler external to the building/housing container. The cooling system 120 can include, but is not limited to evaporative cooling, free air, rejection to large thermal mass, and waste heat recovery designs. Cooling system 120 may include or be coupled to a cooling liquid source that provide cooling liquid.

In one embodiment, each server chassis is coupled to the cooling liquid manifold modularly, such that a server chassis can be removed from the electronic rack without affecting the operations of remaining server chassis in the electronic rack and the cooling liquid manifold. In another embodiment, each server chassis is coupled to the cooling liquid manifold through a quick-release coupling assembly having a server liquid intake connector and a server liquid outlet connector coupled to a flexible hose to distribute the cooling liquid to the cold plates of the processors. The server liquid intake connector is to receive cooling liquid via a rack liquid intake connector from a cooling liquid manifold mounted on a backend of the electronic rack. The server liquid outlet connector is to emit warmer or hotter liquid carrying the heat exchanged from the processors to the cooling liquid manifold via a rack liquid outlet connector and then back to a coolant distribution unit (CDU) within the electronic rack.

In one embodiment, the cooling liquid manifold disposed on the backend of each electronic rack is coupled to liquid supply line 132 (also referred to as a room supply manifold) to receive cooling liquid from cooling system 120. The cooling liquid is distributed through a liquid distribution loop attached to a cold plate assembly on which a processor is mounted to remove heat from the processors. A cold plate is configured similar to a heat sink with a liquid distribution tube attached or embedded therein. The resulting warmer or hotter liquid carrying the heat exchanged from the processors is transmitted via liquid return line 131 (also referred to as a room return manifold) back to cooling system 120.

Liquid supply/return lines 131-132 are referred to as data center or room liquid supply/return lines (e.g., global liquid supply/return lines), which supply cooling liquid to all of the electronic racks of rows 101-102. The liquid supply line 132 and liquid return line 131 are coupled to a heat exchanger of a CDU located within each of the electronic racks, forming a primary loop. The secondary loop of the heat exchanger is coupled to each of the server chassis in the electronic rack to deliver the cooling liquid to the cold plates of the processors.

In one embodiment, data center system 100 further includes an optional airflow delivery system 135 to generate an airflow to cause the airflow to travel through the air space of the server chassis of the electronic racks to exchange heat generated by the computing nodes due to operations of the computing nodes (e.g., servers) and to exhaust the airflow exchanged heat to an external environment or a cooling system (e.g., air-to-liquid heat exchanger) to reduce the temperature of the airflow. For example, air supply system 135 generates an airflow of cool/cold air to circulate from aisle 103 through electronic racks 110A-110N to carry away exchanged heat.

The cool airflows enter the electronic racks through their frontends and the warm/hot airflows exit the electronic racks from their backends. The warm/hot air with exchanged heat is exhausted from room/building or cooled using a separate cooling system such as an air-to-liquid heat exchanger. Thus, the cooling system is a hybrid liquid-air cooling system, where a portion of the heat generated by a processor is removed by cooling liquid via the corresponding cold plate, while the remaining portion of the heat generated by the processor (or other electronics or processing devices) is removed by airflow cooling.

Figure 2:
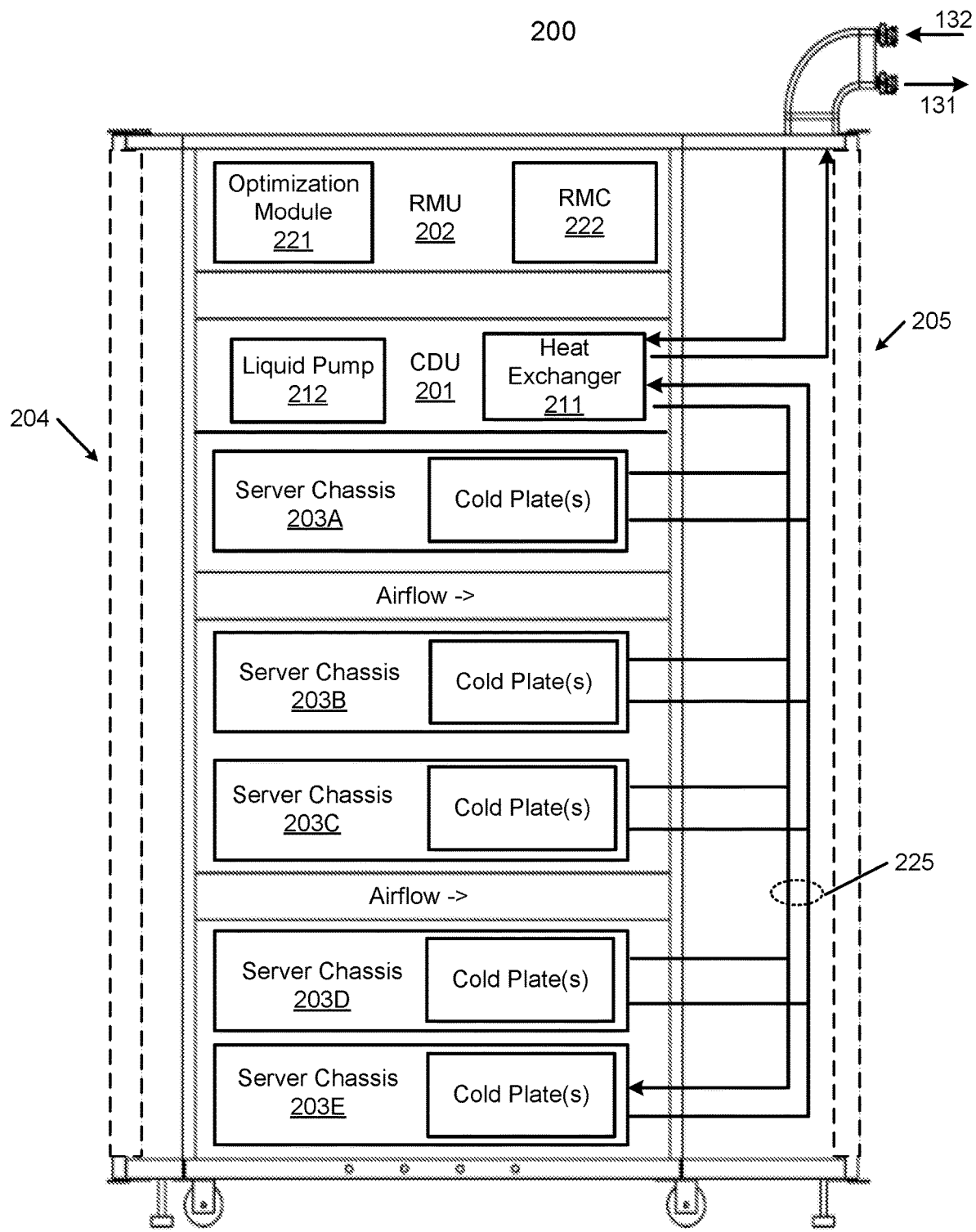
FIG. 2 is a block diagram illustrating an example of an electronic rack according to one embodiment.

FIG. 2 illustrates an electronic rack according to one embodiment. Electronic rack 200 may represent any of the electronic racks as shown in FIG. 1, such as, for example, electronic racks 110A-110N. Referring to FIG. 2, according to one embodiment, electronic rack 200 includes, but is not limited to, cooling distribution unit (CDU) 201, rack management unit (RMU) 202, and one or more server chassis 203A-203E (collectively referred to as server chassis 203). Server chassis 203 can be inserted into an array of server slots (e.g., standard shelves) respectively from frontend 204 or backend 205 of electronic rack 200. Note that although there are five server chassis 203A-203E shown here, more or fewer server chassis may be maintained within electronic rack 200. Also note that the particular positions of CDU 201, RMU 202, and/or server chassis 203 are shown for the purpose of illustration only; other arrangements or configurations of CDU 201, RMU 202, and/or server chassis 203 may also be implemented. In one embodiment, electronic rack 200 can be either open to the environment or partially contained by a rack container, as long as the cooling fans can generate airflows from the frontend to the backend.

In addition, for at least some of the server chassis 203, an optional fan module (not shown) is associated with the server chassis. Each of the fan modules includes one or more cooling fans. The fan modules may be mounted on the backends of server chassis 203 or on the electronic rack to generate airflows flowing from frontend 204, traveling through the air space of the sever chassis 203, and existing at backend 205 of electronic rack 200.

In one embodiment, CDU 201 mainly includes heat exchanger 211, liquid pump 212, and a pump controller (not shown), and some other components such as a liquid reservoir, a power supply, monitoring sensors and so on. Heat exchanger 211 may be a liquid-to-liquid heat exchanger. Heat exchanger 211 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 205 of electronic rack 200. The liquid supply/return lines 131-132, also referred to as room liquid supply/return lines, may be coupled to cooling system 120 as described above.

In addition, heat exchanger 211 further includes a second loop with two ports having a second pair of liquid connectors coupled to liquid manifold 225 (also referred to as a rack manifold) to form a secondary loop, which may include a supply manifold (also referred to as a rack liquid supply line or rack supply manifold) to supply cooling liquid to server chassis 203 and a return manifold (also referred to as a rack liquid return line or rack return manifold) to return warmer liquid back to CDU 201. Note that CDUs 201 can be any kind of CDUs commercially available or customized ones. Thus, the details of CDUs 201 will not be described herein.

Each of server chassis 203 may include one or more IT components (e.g., central processing units or CPUs, such as either a ×86 CPU or an ARM CPU, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Electronic rack 200 further includes optional RMU 202 configured to provide and manage power supplied to servers 203, and CDU 201. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, computing nodes 203, CDU 201, and the fan modules. Specifically, the monitor receives operating data from various sensors representing the operating environments of electronic rack 200. For example, the monitor may receive operating data representing temperatures of the processors, cooling liquid, and airflows, which may be captured and collected via various temperature sensors. The monitor may also receive data representing the fan power and pump power generated by the fan modules 231 and liquid pump 212, which may be proportional to their respective speeds. These operating data are referred to as real-time operating data. Note that the monitor may be implemented as a separate module within RMU 202.

Based on the operating data, optimization module 221 performs an optimization using a predetermined optimization function or optimization model to derive a set of optimal fan speeds for fan modules 231 and an optimal pump speed for liquid pump 212, such that the total power consumption of liquid pump 212 and fan modules 231 reaches minimum, while the operating data associated with liquid pump 212 and cooling fans of the fan modules are within their respective designed specifications. Once the optimal pump speed and optimal fan speeds have been determined, RMC 222 configures liquid pump 212 and cooling fans of fan modules 231 based on the optimal pump speeds and fan speeds.

As an example, based on the optimal pump speed, RMC 222 communicates with a pump controller of CDU 201 to control the speed of liquid pump 212, which in turn controls a liquid flow rate of cooling liquid supplied to the liquid manifold 225 to be distributed to at least some of server chassis 203. Similarly, based on the optimal fan speeds, RMC 222 communicates with each of the fan modules to control the speed of each cooling fan of the fan modules 231, which in turn control the airflow rates of the fan modules. Note that each of fan modules may be individually controlled with its specific optimal fan speed, and different fan modules and/or different cooling fans within the same fan module may have different optimal fan speeds.

Note that the rack configuration as shown in FIG. 2 is shown and described for the purpose of illustration only; other configurations or arrangements may also be applicable. For example, CDU 201 may be an optional unit. The cold plates of server chassis 203 may be coupled to a rack manifold, which may be directly coupled to room manifolds 131-132 without using a CDU. Although not shown, a power supply unit may be disposed within electronic rack 200. The power supply unit may be implemented as a standard chassis identical or similar to a sever chassis, where the power supply chassis can be inserted into any of the standard shelves, replacing any of server chassis 203. In addition, the power supply chassis may further include a battery backup unit (BBU) to provide battery power to server chassis 203 when the main power is unavailable. The BBU may include one or more battery packages and each battery package include one or more battery cells, as well as the necessary charging and discharging circuits for charging and discharging the battery cells.

Figure 3:
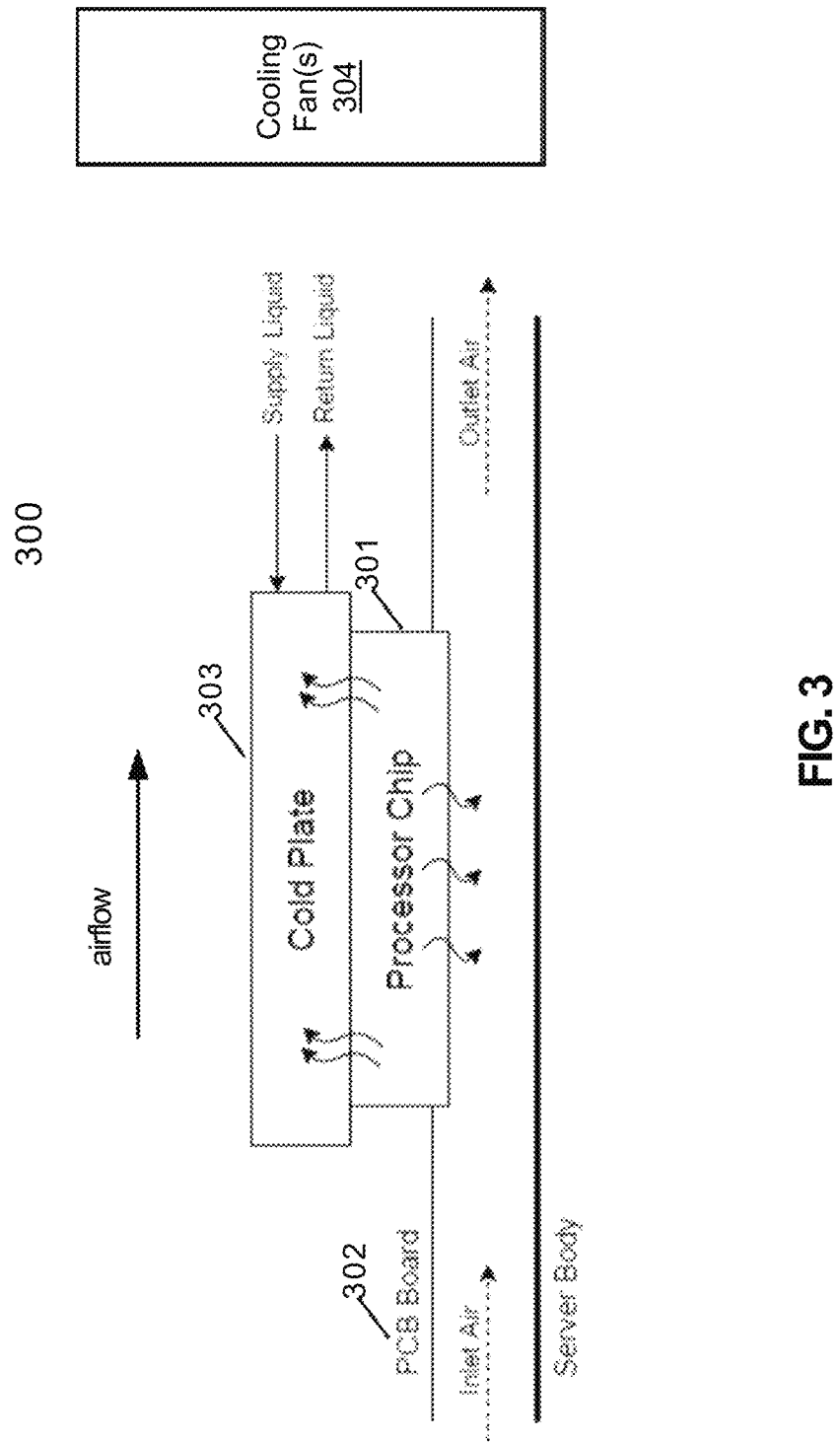
FIG. 3 is a block diagram illustrating an example of a cold plate configuration according to one embodiment.

FIG. 3 is a block diagram illustrating a processor cold plate configuration according to one embodiment. The processor/cold plate assembly 300 can represent any of the processors/cold plate structures of server chassis 203 as shown in FIG. 2. Referring to FIG. 3, processor 301 is plugged onto a processor socket mounted on printed circuit board (PCB) or motherboard 302 coupled to other electrical components or circuits of a data processing system or server. Processor 301 also includes a cold plate 303 attached to it, which is coupled to a rack manifold that is coupled to liquid supply line 132 and/or liquid return line 131. A portion of the heat generated by processor 301 is removed by the cooling liquid via cold plate 303. The remaining portion of the heat enters into an air space underneath or above, which may be removed by an airflow generated by cooling fan 304. Various embodiments of the cold plate 303 will now be described.

FIG. 4 is an exploded view illustrating various elements of a cooling plate according to an embodiment. In FIG. 4 (and other Figures herein) various elements are illustrated as transparent, so as to enable visualization of interior structures for better understanding of the design. In this example, the cooling plate is made of two shells 410 and 412, also referred to as mainframes, which in this example are identical. Also, the cooling plate includes fins module 420 that is housed within the two shells. Each of the shells 410 and 412 may be made of thermally conductive material, e.g., aluminum or copper, and a fluid chamber 416 and 418 is formed in the shells, respectively. Additionally, each shell has a fluid channel 413 and 415 formed at the bottom of the fluid chamber. Finally, a fluid port 417 and 419 provides fluid communication between the respective fluid chamber and the exterior of the respective shell, so as to circulate cooling fluid from a cooling system. The callout of FIG. 4 illustrates the profile shape of the shell 412 at the cross-section indicated by line A-A, and showing the relative orientation of the fluid chamber 418 and fluid channel 415. Shell 410 may be fabricated identically to shell 412, except that it is shown flipped upside-down in FIG. 4. As shown in the callout, the fluid chamber 418 has a solid bottom, an open top, and a defined depth. It needs to be motioned that while the shape of the cross-section of the fluid channel 413, 415 as well as the fluid ports 417, 419, may vary, they are more commonly designed in semicircle and round, respectively.

The fins module is formed of a plurality of fins 422, which may take on various shapes and number. In this particular example, two sets or rows of fins 422 are attached in parallel to a baffle plate 424. The fins are sized to have a height (or width) commensurate with the depth of the fluid chamber. In this manner, when the two shells are attached together, the fins 422 may touch the bottom wall of the fluid chambers, as illustrated in FIG. 4A.

FIG. 4A is a cross-section view taken along lines B-B of FIG. 4, after the entire cooling plate has been assembled. That is, shell 410 has been attached to shell 412, with fins assembly 420 inserted inside the void formed by the two fluid chambers 416 and 418. Incidentally, as the two shells are symmetrical, in the example of FIG. 4A one shell is rotated 180°, so that port 417 is on one side, while port 419 is in the opposite side of the cooling plate. Of course, as illustrated in FIG. 4, both ports may be on the same side. As shown in FIG. 4A, the fins 422 extend from the bottom of fluid chamber 418 to the bottom (or ceiling) of fluid chamber 416. Consequently, each space between two fins 422 forms a fin channel 426. That is, fluid entering via one port, say port 419 would flow inside channel 415, then would disperse though the multiple fin channels to fluid channel 413, and then exit via the port 417. As the incoming fluid is cool, it acts to transport heat away from the cooling plate, thereby removing heat from any element which is in contact with the cooling plate, e.g., a microchip.

In one example, the fin assembly 420 is affixed to at least one of the shells. For example, the fins may be welded to one of the shells or be cold welded using, e.g., indium welding agent. This improved thermal conductivity between the shells and the fins. Also, in this example, since the shells are symmetrical, the fluid channels 413 and 415 face each other when the cooling plate is assembled. This may lead to cooling fluid flowing directly from one channel 413 and 415 to the other channel, thereby reducing cooling efficiency. To avoid such direct flow, in this example baffle plate 424 is provided in the middle of the fins 422, so that when assembled, it forces the cooling fluid to flow around it, thereby preventing direct flow from one fluid channel to the other. To be sure, while some other embodiments may be shown without the baffle plate, any of the disclosed embodiments may be implemented with the baffle plate.

The fins module 420 of FIG. 4 is made of several pairs of fins arranged in parallel, e.g., two sets of fins. Of course, the fins module may be made using several single fins having width of twice the depth of each fluid chamber. This way, upon installation each single fin would extend from the bottom of one fluid chamber to the bottom of the complementary fluid chamber. On the other hand, by using pairs of fins, each having width corresponding to the depth on one fluid chamber, different arrangements of the fins are possible. The following embodiments provide some examples.

FIG. 5 illustrates an embodiment wherein one set of fins inserted in one fluid chamber is placed orthogonal to the other set of fins placed in the complementary fluid chamber. FIG. 5 shows the two halves of the cooling plate prior to final assembly. The upper half is made up of shell 510 having fins 522 inserted in the fluid chamber thereof, and having fluid channel 513 leading to port 517. Note that in this example the fluid channel 513 is oriented perpendicular to the fins 522. In order to have the fluid fully distributed within the fluid chamber as well as the fluid channels formed by the fins, multiple fluid channel design is proposed. The basic design requires minimum two channels, one primary fluid channel and one secondary fluid channel, but more channels may be formed. The primary fluid channel is the one connected with the fluid port, and the secondary fluid channel is the one perpendicular to the primary fluid. If the primary fluid channel is perpendicular to the fins, then secondary channel is not required, but it may improve performance. If the primary fluid channel is in parallel with the fin, then the secondary channel is a required structure.

The following designs consider different types of combination scenarios. In FIG. 5, fluid ports 517 and 519 are perpendicular to the fin, so the secondary channel is not necessary, but good to have. The secondary channel 533 is formed perpendicular to the main fluid channel 513. The secondary fluid channel 533 is oriented parallel to the fins 522, and it is used for assisting fluid distributing. The complementary shell 512 has the primary fluid chamber 519 oriented perpendicularly to the fins. Therefore, a secondary fluid channel 535 is provided and is oriented perpendicularly to the main fluid channel 515 for assisting the coolant flow. When the two shells 510 and 512 are attached to each other, the fins 522 are oriented perpendicularly to fins 523, which increases flow resistance and thereby enhances heat transfer. Again, in this example each of the ports 517 and 519 is perpendicular to the fins.

FIG. 6 illustrates another example of a cooling plate wherein each shell includes a main fluid channel and a secondary cooling channel. The two shells are identical, and the difference between FIG. 5 and FIG. 6 are the assembly. The two ports are in perpendicular direction after assembled together in FIG. 5, but are parallel in the same direction in FIG. 6. In the embodiment of FIG. 6 both sets of fins are parallel to each other, which reduces flow resistance, thus reducing pressure. Other than the changes in orientations, the elements of the embodiment of FIG. 6 are the same as that of FIG. 5, and so are labeled with the same reference numerals.

In the embodiment of FIG. 6, just as with the embodiment of FIG. 5, the ports are positioned perpendicularly to the fins, which means minimum requirement is one fluid channel. However, this is not a requirement. FIG. 7 illustrates an embodiment wherein one port is perpendicular to the fins, while the other port is parallel with the fins. Also, in FIG. 7 the two sets of fins are arrange perpendicularly to each other, just as in the embodiment of FIG. 5. Again, other than the changes in orientations, the elements of the embodiment of FIG. 7 are the same as that of FIG. 5, and so are labeled with the same reference numerals. From the variations illustrated in FIGS. 5-7, one may see the powerful benefits of the disclosed designs, i.e., the two shells may be manufactured identical to each other, and the same sets of fins may be used in various orientations so as to provide different flow resistance/pressure so as to provide different thermal transfer capabilities without having to redesign or remanufacture the parts. The two fluid channels design (primary and secondary) in perpendicular in one shell provides benefits for strong flexibilities on the structure design and assembly.

In the embodiments of FIGS. 5-7 a secondary fluid channel is provided either to enable assisting fluid flow off main fluid channel (FIG. 5, FIG. 6, and 535 in FIG. 7), or function as the main fluid channel (such as 533 in FIG. 7). It can be seen that by such design, the main fluid channel does not have to be primary channel connected with the fluid port.

Figure 8:
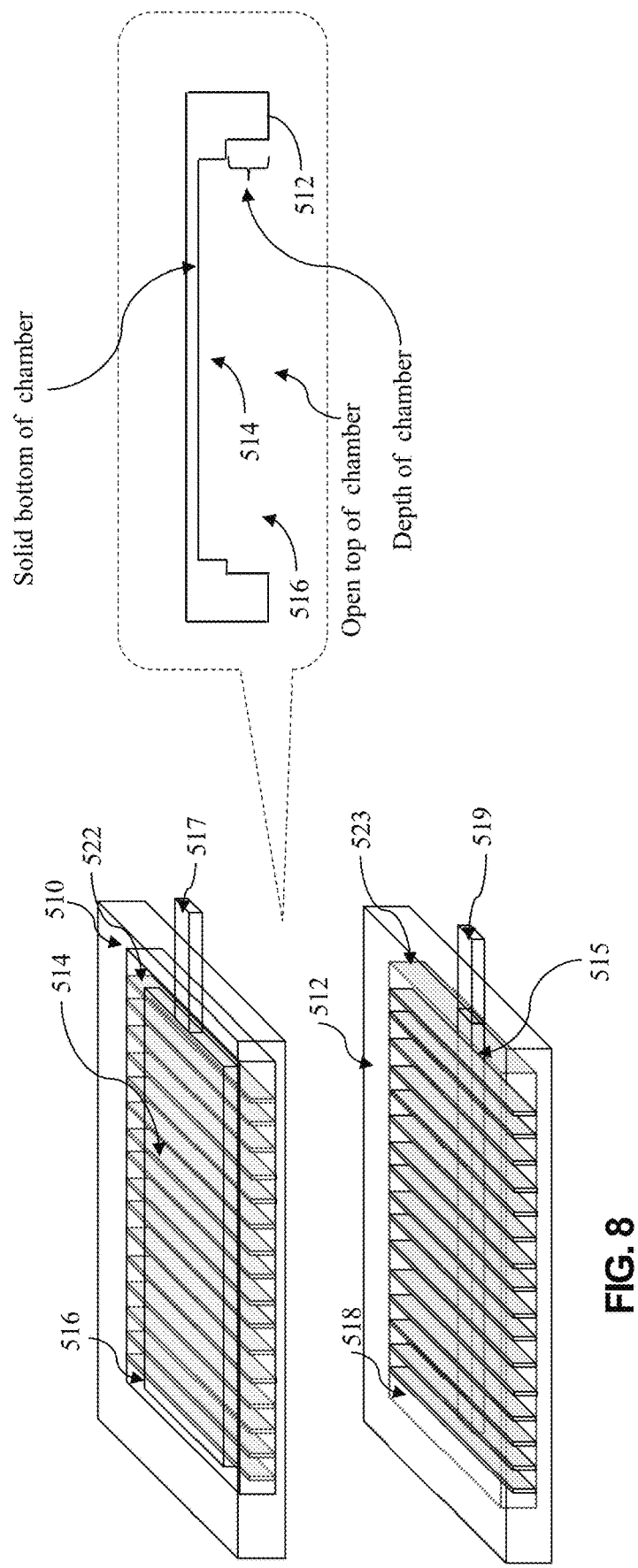
FIG. 8 illustrates an embodiment having a secondary fluid chamber.

FIG. 8 illustrates another alternative, which does not require a secondary channel. In the example of FIG. 8, the bottom shell is constructed in the same manner as illustrated in the embodiment of, e.g., FIG. 4, i.e., with only one fluid channel 515. Fins 523 are provided inside the fluid chamber 518 and are positioned perpendicularly to the fluid channel 515. The upper shell 510 also has fins 522 inserted inside fluid chamber 516. However, rather than having a regular secondary fluid channel, the upper shell includes a wider secondary channel, which may be referred to as secondary fluid chamber 514, underneath the fins. Note that this is mainly intended to be used for upper shell in a phase change cooling use case. The fins are partially in contact with the bottom of the fluid chamber 516. Secondary fluid chamber 514 may be in different sizes that are smaller than the main fluid chamber 516. The secondary fluid channel 514 is connected to the port 517. Note that in this particular example the fins in fluid chamber 516 are parallel to the fins in fluid chamber 518, but this is not mandatory, as a perpendicular arrangement can also work. Fluid port 517 can be in different sides of the shell 510. Also, notably this embodiment is particularly beneficial for systems employing phase change in the cooling cycle. For example, cooling liquid may enter via port 519 and, as the cooling liquid removes heat from the fins on its way to the top shell, it may change phase to vapor. Thus, the secondary fluid chamber 514 may be configured to accept the vapor, which may require expanded volume as compared to the liquid phase.

Figure 9:
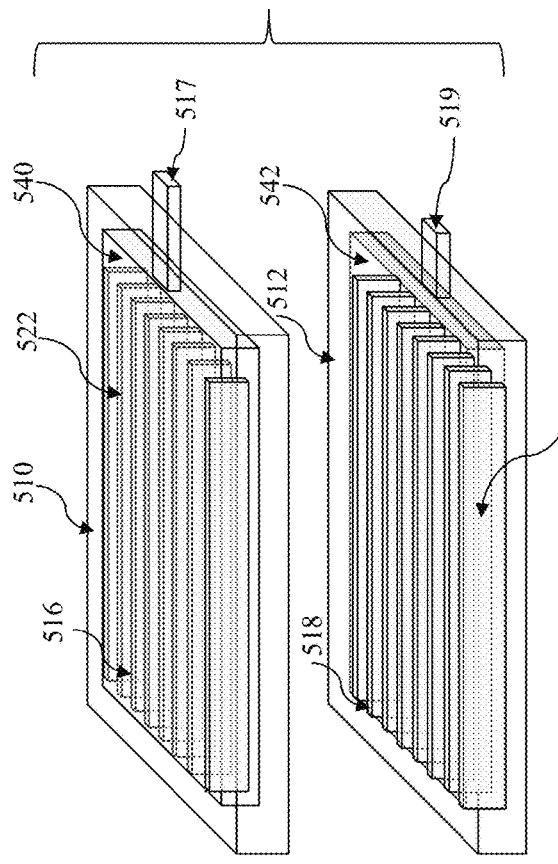
FIG. 9 illustrates an embodiment having fluid channel formed by short fins.

FIG. 9 illustrates another example wherein no fluid channels are formed in the shells. Rather, the fins are made shorter than the length of the fluid chamber, thereby creating a fluid channel that leads to the port. The left side of FIG. 9 illustrates the elements of the cooling plate prior to final assembly, while the right side illustrates the cooling plate after completing assembly. Here again, each of the shells 510 and 512 may be made identical, having a fluid chamber formed therein. Each of the fluid chambers is closed on one side and open on the other side, so that when the two shells are attached to each other, the two fluid chambers combine to form one large fluid chamber. As shown in FIG. 9, each fin 522 has a width that is the same as the depth of the fluid chamber 516, but a length that is shorter than the length of the fluid chamber 516. Thus, when the fins 522 are assembled inside the fluid chamber 516 they abut one side of the fluid chamber 516, but leave a space 540 on the other side of the fluid chamber 516. Consequently, the space 540 in essence defines a fluid channel for distributing fluid to all the fluid channels among the fins. Note that while in FIG. 9 both input and output ports are on the same side, one of the shells may be rotated prior to assembly to have input and output ports on opposite sides.

Figure 10:
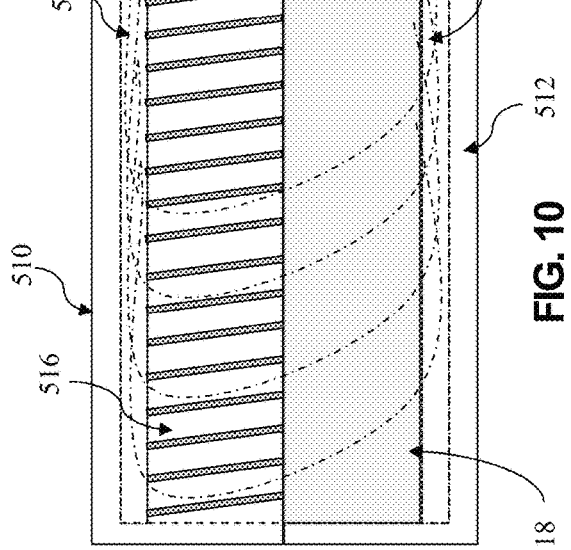
FIG. 10 illustrates a cross section of a cooling plate according to an embodiment.

FIG. 10 illustrates a side cross-section of an embodiment wherein one set of fins is perpendicular to the other set of fins. In FIG. 10, the bottom shell 512 has a fluid chamber 518 that is open at top side thereof. Fluid channel 515 is formed at the closed bottom end of the fluid chamber and leads to the inlet port 519. The top shell 510 includes a complementary fluid chamber 516 which is open at the bottom, so that when the two shells are assembled the two fluid chambers 516 and 518 form one large fluid chamber. A fluid channel 513 is formed at the closed bottom of the fluid chamber 516 and leads to the outlet port 517. Fins 522 are attached inside the fluid chamber 516 at an inclined or acute angle to the bottom of the fluid chamber 516. Fins 523 are attached inside the fluid chamber 518 oriented perpendicular to the fins 522. Fins 523 may be arranged at an incline or orthogonal angle to the bottom of fluid chamber 518. As illustrated by the dash-dot lines, fluid enters via the inlet port 519 into the fluid channel 515. From there it is dispersed through the spaces in between fins 523 and then fins 522, reaching fluid channel 513 at the top, and then exit via outlet port 517.

Figure 11:
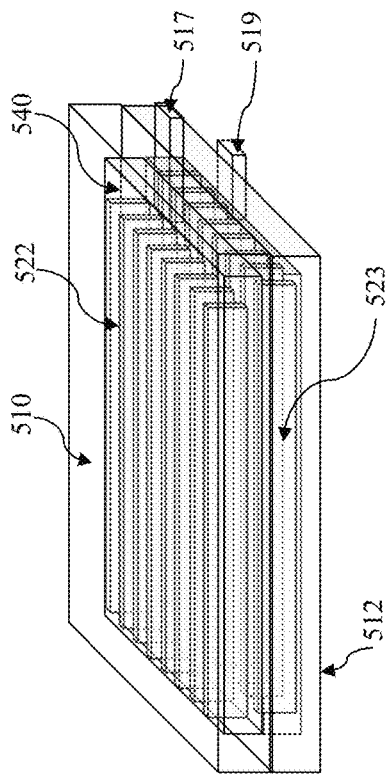
FIG. 11 illustrates a cross section of a cooling plate according to another embodiment.

FIG. 11 illustrates a side cross-section of an embodiment wherein one set of fins is parallel, but at an incline, to the other set of fins. In FIG. 11, the bottom shell 512 has a fluid chamber 518 that is open at top side thereof. Fluid channel 515 is formed at the closed bottom end of the fluid chamber 518 and leads to the inlet port 519. The top shell 510 includes a complementary fluid chamber 516 which is open at the bottom, so that when the two shells are assembled the two fluid chambers 516 and 518 form one large fluid chamber. A fluid channel 513 is formed at the closed bottom of the fluid chamber 516 and leads to the outlet port 517. Note that in this example the port 517 is in the opposite side of the inlet port 519. Since the two shells are identical and symmetrical, the ports can be aligned either way. Fins 522 are attached inside the fluid chamber 516 at an inclined angle to the bottom of the fluid chamber 516, while fins 523 are attached inside the fluid chamber 518 oriented in parallel and aligned to the fins 522. Fins 523 are shown arranged at an opposite incline angle to the bottom of fluid chamber 518, but this is only one example. As illustrated by the dash-dot lines, fluid enters via the inlet port 519 into the fluid channel 515. From there it is dispersed through the spaces in between fins 523 and then fins 522, reaching fluid channel 513 at the top, and then exit via outlet port 517.

Figure 12:
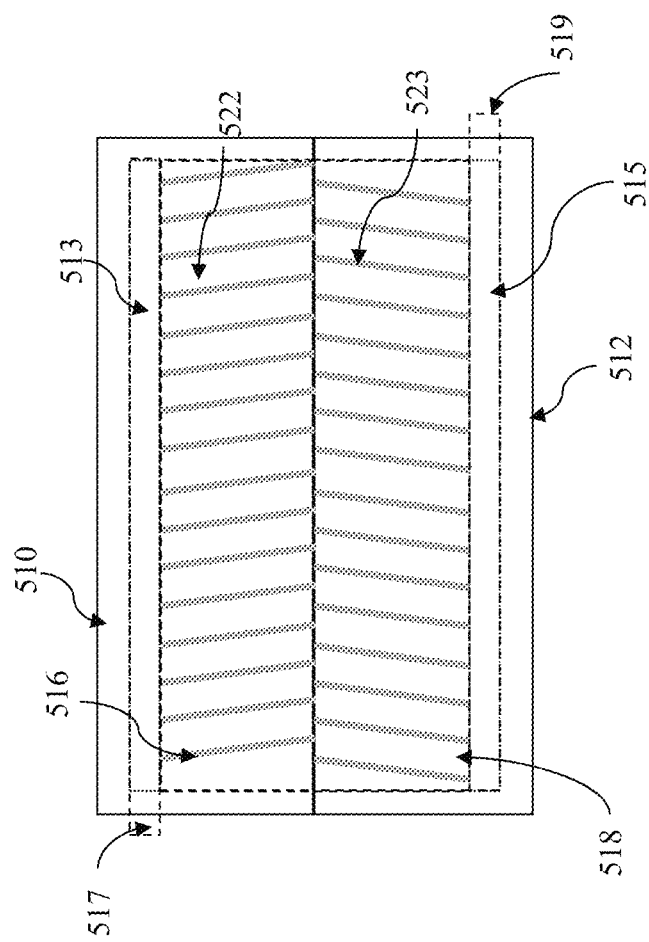
FIG. 12 illustrates a cross section of a cooling plate according to yet another embodiment.

FIG. 12 illustrates an embodiment similar to that shown in FIG. 11, except that the fins 523 are staggered with fins 522, such that each fin 523 is aligned between two fins 522. Otherwise, the two embodiments are similar.

Figure 13:
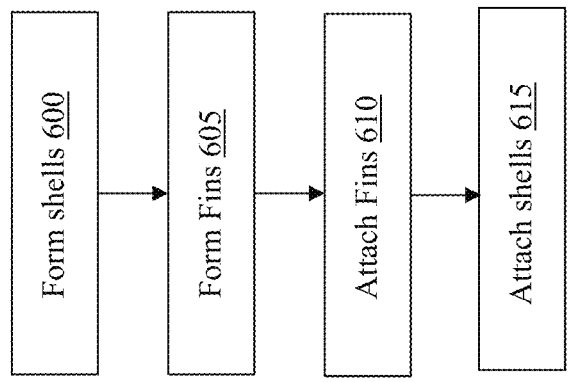
FIG. 13 is a flow chart illustrating an embodiment for a method of fabricating the cooling plate.

FIG. 13 is a flow chart illustrating an embodiment for a method of fabricating the cooling plate. In step 600 the shells are made by forming fluid cavity or chamber in each shell, and forming a port in fluid communication to the fluid cavity. Forming the cavity may be done by, e.g., milling a solid block of metal, such as aluminum of copper. In this example the two shells are identical, each having a cavity with a solid bottom and an open top (see callout of FIG. 4), such that each shell form a "tub". As shown, in some embodiments one or more fluid channels are also formed in each shell and in fluid communication to the port. The fluid channels may also be formed by milling the metal block. In step 605 the fins are formed. The fins may be formed as two separate sets, as illustrated in some embodiments. In other embodiments the fins may be formed as integral part of the shells by, e.g., machining the fluid cavity while forming the fins during the machining process. The fins are sized so as to have a length matching the length of the cavity and width that matches the depth of the cavity. Note that when the fins are attached in an oblique angle inside the fluid cavity, the width of the fins may be a bit larger than the depth of the cavity.

In step 610 the fins are attached inside the fluid cavity of at least one shell. Better thermal conductivity may be achieved by physical attachment using conductive agent, such as by welding. If the fins are formed integrally to the shells then this step can be skipped. In step 615 one shell is flipped and placed on the second shell, such that the two cavities face each other to form one large cavity enclosing the fins. The two shells are attached to each other using, e.g., bonding, welding, bolts etc. In another embodiment, the fins can be designed as part of the shell instead of designing as a separate part.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling plate for cooling microchips, comprising:
   a first shell having a first fluid chamber formed therein, the first fluid chamber having a solid bottom, an open top, a first fluid port in communication with the first fluid chamber;
   a first set of fins including a plurality of fins, wherein each fin in the first set of fins has a length matching a length of the first fluid chamber and width commensurate with a depth of the first fluid chamber;
   a second shell having a second fluid chamber formed therein, the second fluid chamber having a solid bottom, an open top, a second fluid port in communication with the second fluid chamber; and
   a second set of fins including a plurality of fins, wherein each fin in the second set of fins has a length matching a length of the second fluid chamber and a width commensurate with a depth of the second fluid chamber;
   wherein the first shell is attached to the second shell such that the open top of the first fluid chamber faces the open top of the second fluid chamber and so that the first and second sets of fins are arranged inside the first and second fluid chambers;
   wherein the first set of fins is attached inside the first fluid chamber and the second set of fins is attached inside the second fluid chamber; and
   wherein the first set of fins is attached inside the first fluid chamber perpendicularly to the second set of fins attached inside the second fluid chamber.

2. The cooling plate of claim 1, wherein a fluid channel in fluid communication with the first fluid port is formed in the solid bottom of the first fluid chamber and a fluid channel in fluid communication with the second fluid port is formed in the solid bottom of the second fluid chamber.

3. The cooling plate of claim 2, further comprising a baffle plate positioned between the first set of fins and the second set of fins.

4. The cooling plate of claim 2, wherein each of the first shell and second shell further comprises a secondary fluid channel formed in the solid bottom of each fluid chamber and oriented perpendicularly to the fluid channel and in fluid communication to the fluid channel.

5. The cooling plate of claim 1, wherein:
   the first set of fins forms an acute angle with the solid bottom of the first fluid chamber,
   the second set of fins forms an acute angle with the solid bottom of the second fluid chamber, or
   the first set of fins forms an acute angle with the solid bottom of the first fluid chamber and the second set of fins forms an acute angle with the solid bottom of the second fluid chamber.

6. The cooling plate of claim 1, wherein a fluid channel in fluid communication with the first fluid port is formed in the solid bottom of the first fluid chamber and a fluid channel in fluid communication with the second fluid port is formed in the solid bottom of the second fluid chamber, and wherein the fluid channel formed in the solid bottom of the first fluid chamber has different dimensions from the fluid channel formed in the solid bottom of the second fluid chamber.

7. The cooling plate of claim 1, wherein the shape of the first and second shells is identical to each other.

8. The cooling plate of claim 1, wherein the first shell further includes a secondary fluid chamber formed in the solid bottom of the first fluid chamber or the second shell further includes a secondary fluid chamber formed in the solid bottom of the second fluid chamber.

9. A server chassis, comprising:
   one or more processors; and
   one or more cold plates attached to the one or more processors respectively, wherein each of the cold plates comprises:
      a first shell having a first fluid chamber formed therein, the first fluid chamber having a solid bottom, an open top, a first fluid port in communication with the first fluid chamber,
      a first set of fins including a plurality of fins, wherein each fin in the first set of fins has a length matching a length of the first fluid chamber and width commensurate with a depth of the first fluid chamber,
      a second shell having a second fluid chamber formed therein, the second fluid chamber having a solid bottom, an open top, a second fluid port in communication with the second fluid chamber, and
      a second set of fins including a plurality of fins, wherein each fin in the second set of fins has a length matching a length of the second fluid chamber and a width commensurate with a depth of the second fluid chamber;
      wherein the first shell is attached to the second shell such that the open top of the first fluid chamber faces the open top of the second fluid chamber and so that the first and second sets of fins are arranged inside the first and second fluid chambers;
      wherein the first set of fins is attached inside the first fluid chamber and the second set of fins is attached inside the second fluid chamber; and
      wherein the first set of fins is attached inside the first fluid chamber perpendicularly to the second set of fins attached inside the second fluid chamber.

10. The server chassis of claim 9, wherein a fluid channel in fluid communication with the first fluid port is formed in the solid bottom of the first fluid chamber and a fluid channel in fluid communication with the second fluid port is formed in the solid bottom of the second fluid chamber.

11. The server chassis of claim 10, wherein each cold plate further comprises a baffle plate positioned between the first set of fins and the second set of fins.

12. The server chassis of claim 10, wherein each of the first shell and second shell further comprises a secondary fluid channel formed in the solid bottom of each fluid chamber and oriented perpendicularly to the fluid channel and in fluid communication to the fluid channel.

13. An electronic rack, comprising:
   a plurality of server chassis, each of the server chassis including one or more processors; and
   one or more cold plates attached to the one or more processors respectively, wherein each of the cold plates comprises:
      a first shell having a first fluid chamber formed therein, the first fluid chamber having a solid bottom, an open top, a first fluid port in communication with the first fluid chamber,
      a first set of fins including a plurality of fins, wherein each fin in the first set of fins has a length matching a length of the first fluid chamber and width commensurate with a depth of the first fluid chamber, a second shell having a second fluid chamber formed therein, the second fluid chamber having a solid bottom, an open top, a second fluid port in communication with the second fluid chamber, and a second set of fins including a plurality of fins, wherein each fin in the second set of fins has a length matching a length of the second fluid chamber and a width commensurate with a depth of the second fluid chamber;

wherein the first shell is attached to the second shell such that the open top of the first fluid chamber faces the open top of the second fluid chamber and so that the first and second sets of fins are arranged inside the first and second fluid chambers, wherein the first set of fins is attached inside the first fluid chamber and the second set of fins is attached inside the second fluid chamber, and wherein the first set of fins is attached inside the first fluid chamber perpendicularly to the second set of fins attached inside the second fluid chamber.

14. A cooling plate for cooling microchips, comprising:

a first shell having a first fluid chamber formed therein, the first fluid chamber having a solid bottom, an open top, a first fluid port in communication with the first fluid chamber;

a first set of fins including a plurality of fins, wherein each fin in the first set of fins has a length matching a length of the first fluid chamber and width commensurate with a depth of the first fluid chamber;

a second shell having a second fluid chamber formed therein, the second fluid chamber having a solid bottom, an open top, a second fluid port in communication with the second fluid chamber; and a second set of fins including a plurality of fins, wherein each fin in the second set of fins has a length matching a length of the second fluid chamber and a width commensurate with a depth of the second fluid chamber;

wherein the first shell is attached to the second shell such that the open top of the first fluid chamber faces the open top of the second fluid chamber and so that the first and second sets of fins are arranged inside the first and second fluid chambers;

wherein the first set of fins is attached inside the first fluid chamber and the second set of fins is attached inside the second fluid chamber; and wherein the first set of fins and second set of fins are attached such that the fins are staggered so that each of the fins of the first set of fins is aligned between two fins of the second set of fins.

\* \* \* \* \*